United States Patent
Wu

(10) Patent No.: US 10,197,828 B2
(45) Date of Patent: Feb. 5, 2019

(54) DISPLAY DEVICE AND CONTROL METHOD THEREOF

(71) Applicant: BOE TECHNOLOGY GROUP CO., LTD., Beijing (CN)

(72) Inventor: Yanbing Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/571,132

(22) PCT Filed: May 24, 2017

(86) PCT No.: PCT/CN2017/085694
§ 371 (c)(1),
(2) Date: Nov. 1, 2017

(87) PCT Pub. No.: WO2017/206776
PCT Pub. Date: Dec. 7, 2017

(65) Prior Publication Data
US 2018/0231811 A1 Aug. 16, 2018

(30) Foreign Application Priority Data

May 31, 2016 (CN) .......................... 2016 1 0379214

(51) Int. Cl.
*G02F 1/13* (2006.01)
*G02F 1/1335* (2006.01)
(Continued)

(52) U.S. Cl.
CPC .......... *G02F 1/1323* (2013.01); *G02F 1/1336* (2013.01); *G02F 1/133555* (2013.01);
(Continued)

(58) Field of Classification Search
None
See application file for complete search history.

(56) References Cited

U.S. PATENT DOCUMENTS

2007/0008456 A1* 1/2007 Lesage ................. G02B 6/0038
349/62
2009/0067156 A1* 3/2009 Bonnett ............... G02B 6/0068
362/97.2
(Continued)

FOREIGN PATENT DOCUMENTS

| CN | 101405645 A | 4/2009 |
|---|---|---|
| CN | 104880760 A | 9/2015 |

(Continued)

OTHER PUBLICATIONS

International Search Report & Written Opinion dated Aug. 29, 2017, regarding PCT/CN2017/085694.

*Primary Examiner* — Jany Richardson
(74) *Attorney, Agent, or Firm* — Intellectual Valley Law, P.C.

(57) ABSTRACT

A display device and a control method thereof are provided. The display device includes a light emitter, configured to emit light; and a light reflector, configured to reflect the light from the light emitter onto one or more side viewing regions of a viewing region of a display panel. The viewing region further includes a front viewing region in front of the display panel. The one or more side viewing regions are adjacent to the front viewing region.

17 Claims, 5 Drawing Sheets

(51) Int. Cl.
  *H01L 25/13*      (2006.01)
  *H01L 25/16*      (2006.01)
  *H01L 51/52*      (2006.01)
  *H05B 37/02*      (2006.01)
  *G02F 1/13357*    (2006.01)

(52) U.S. Cl.
  CPC ............ *H01L 25/13* (2013.01); *H01L 25/162* (2013.01); *H01L 25/167* (2013.01); *H01L 51/5271* (2013.01); *H05B 37/0209* (2013.01); *G02F 2001/133562* (2013.01); *G02F 2001/133616* (2013.01); *G02F 2001/133626* (2013.01)

(56) References Cited

U.S. PATENT DOCUMENTS

| | | |
|---|---|---|
| 2009/0102989 A1 | 4/2009 | Sakai et al. |
| 2016/0349438 A1 | 12/2016 | Ma et al. |

FOREIGN PATENT DOCUMENTS

| | | |
|---|---|---|
| CN | 204631831 U | 9/2015 |
| CN | 205643952 U | 10/2016 |
| TW | 201423223 A | 6/2014 |

\* cited by examiner

DISPLAY DEVICE AND CONTROL METHOD THEREOF

CROSS-REFERENCE TO RELATED APPLICATION

This application is a national stage application under 35 U.S.C. § 371 of International Application No. PCT/CN2017/085694, filed May 24, 2017, which claims the priority of Chinese Patent Application No. 201610379214.3, filed on May 31, 2016, the content of which is incorporated by reference in its entirety.

TECHNICAL FIELD

The present disclosure generally relates to display technologies and, more particularly, relates to display devices and control methods thereof.

BACKGROUND

Today, more and more electronic devices, such as desktops, laptops, cellphones, eBook readers, etc. have adopted electronic display screens and these electronic devices are frequently used in public areas including internet cafes, metro stations, public transport, etc. However, when electronic devices with display screens are used in public areas, the displayed content may include confidential information, that the user does not want other people to view or peep on the display screen from a side angle. That is, the displayed confidential content may be required to only be viewed by the users directly facing the display screen. Therefore, a proper display device with corresponding control methods may be required to display confidential content.

The disclosed display device and control methods are directed to at least partially alleviate one or more problems set forth above and to solve other problems in the art.

SUMMARY

The present disclosure provides a display device and a control method of the display device.

A display device is provided. The display device includes a light emitter, configured to emit light; and a light reflector, configured to reflect the light from the light emitter onto one or more side viewing regions of a viewing region of a display panel. The viewing region further includes a front viewing region in front of the display panel. The one or more side viewing regions are adjacent to the front viewing region.

Optionally, a projection of the light reflector in a plane of the display panel overlaps with at least a display region of the display panel; and the light reflector is further configured to transmit light beams from the display panel when displaying.

Optionally, the light reflector includes a reflective film; and the reflective film is attached on a light-exiting surface of the display panel.

Optionally, the light emitter is configured in the one or more side viewing regions and on one side of the reflective film away from the display panel.

Optionally, a projection of the light reflector in a plane of the display panel overlaps with a non-display region of the display panel.

Optionally, a projection of the light reflector in a plane of the display panel is outside of an outer perimeter of the display panel.

Optionally, the light emitter is configured to emit divergent light beams towards the light reflector.

Optionally, the light emitter includes a light bar and a light-diverging structure.

Optionally, the light bar includes a plurality of light-emitting diode (LED) chips.

Optionally, the light-diverging structure is configured to disperse light beams emitted from the light bar; and the divergent light beams are reflected by the light reflector and converged together to enter the one or more side viewing regions of the viewing region of the display panel.

Optionally, the light-diverging structure includes a lampshade; a plurality of optical dots is arranged on a surface of the lampshade facing to the light bar; and the plurality of optical dots is configured to disperse the light beams emitted from the light bar.

Optionally, the light-diverging structure includes one or more of prisms and concave lens; and the one or more of the prisms and the concave lens are configured to disperse the light beams emitted from the light bar.

Optionally, the light emitter of the display device is arranged and configured at edge regions of the display panel.

Optionally, the display device further includes a controller. The controller is connected with the light emitter; and the controller is configured to turn on or turn off the light emitter.

Optionally, the controller is further configured to adjust a brightness of the light emitted from the light emitter.

Optionally, the display panel is a liquid crystal display (LCD) panel or an organic electroluminescent diode (OELD) display panel.

A method for controlling the disclosed display device is provided. The control method includes turning the light emitter of the display device on to emit light beams in a confidential display mode; and turning the light emitter of the display device off in a normal display mode.

Optionally, in the confidential display mode, a contrast between a brightness of light beams emitted from the display panel and a brightness of reflected light beams from the light emitter is in a range of approximately 5% to 29%.

Optionally, the control method further includes adjusting a brightness of the light emitted from the light emitter in the confidential display mode.

Optionally, the display panel controlled by the control method is an LCD panel or an OELD display panel.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The disclosure will now describe more for example with reference to the following embodiments. It is to be noted that the following descriptions of some embodiments are presented herein for purpose of illustration and description only. It is not intended to be exhaustive or to be limited to the precise form disclosed.

Figure 1:
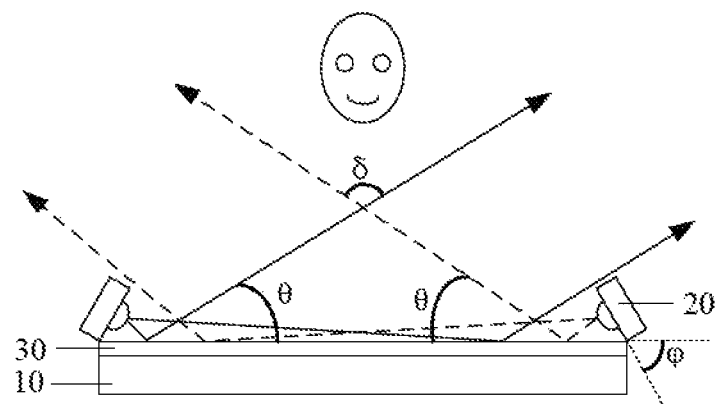
FIG. 1 illustrates a schematic view of an exemplary display device according to various disclosed embodiments of the present disclosure.

FIG. 1 illustrates an exemplary display device according to various disclosed embodiments of the present disclosure. As shown in FIG. 1, the display device may include a display panel 10, a light emitter 20, and a light reflector 30. The light emitter 20 may be configured to emit light and the light reflector 30 may be configured to reflect the light emitted from the light emitter 20 to a predetermined zone of a viewing region of the display panel 10.

For example, the viewing region may include a front viewing region and one or more side viewing regions situated on adjacent side(s) of the front viewing region. The front viewing region may be in line with or directly in front of the display panel 10. Further, the predetermined zone of the viewing region may be in the one or more side viewing regions. For example, the side viewing region may include a view range within a θ angle from the plane of the display panel 10 as shown in FIG. 1. Accordingly, a view range within a δ angle as shown in FIG. 1 may be the front viewing region. The front viewing region may be referred as the viewable region during confidential display.

In one embodiment, in order to secure private viewing, the light emitted from the light emitter 20 may be reflected into a predetermined zone of the viewing region of the display panel 10 such that the displaying light from the display panel 10 may interfere with the reflected light beams from the light emitter 20 in the predetermined zone. As a result, people in the predetermined zone may not be able to clearly view the displayed content on the display panel 10.

In one embodiment, the light emitter 20 may be placed at any appropriate positions as long as the normal display of the display panel 10 is not affected by the light emitter 20. Moreover, the light emitter 20 and the display panel 10 may be mounted by any appropriate method. For example, the light emitter 20 may be mounted on the display panel 10 through an additional mounting structure, or the light emitter 20 may be directly mounted on the display panel 10.

Further, the light emitted from the light emitter 20 may be reflected to the predetermined zone of the viewing region of the display panel 10 through the light reflector 30. Therefore, the incident angle between the light emitted from the light emitter 20 and the surface of the light reflector 30 may be adjusted by tuning the angle φ between the light emitter 20 and the light reflector 30, and thus the light reflected by the light reflector 30 may be ensured to fall into the predetermined zone of the viewing region of the display panel 10.

In addition, the brightness of the light emitted from the light emitter 20 may be fixed or adjustable depending on actual requirements. Moreover, the light reflector 30 may be placed at any appropriate position and may be made of any appropriate material as long as the light emitted from the light emitter 20 can be reflected into the predetermined zone of the viewing region of the display panel 10 without affecting the normal display of the display panel 10.

For example, according to the display device, the light emitted from the light emitter 20 may be reflected into a predetermined zone of the viewing region of the display panel 10. Therefore, the display light emitted from the display panel 10 may interfere with the reflected light emitted from the light emitting structures 20 in the predetermined zone, leading to a decrease in the contrast ratio of the display light emitted from the display panel 10. As a result, people in the predetermined zone may not be able to clearly view the displayed content on the display panel 10. That is, the angle range of the viewable region may be small such that confidential display may be realized. In addition, because the disclosed display device may not require any canyon anti-peeping film, the scope of the application of the disclosed display device may be broad.

Figure 2:
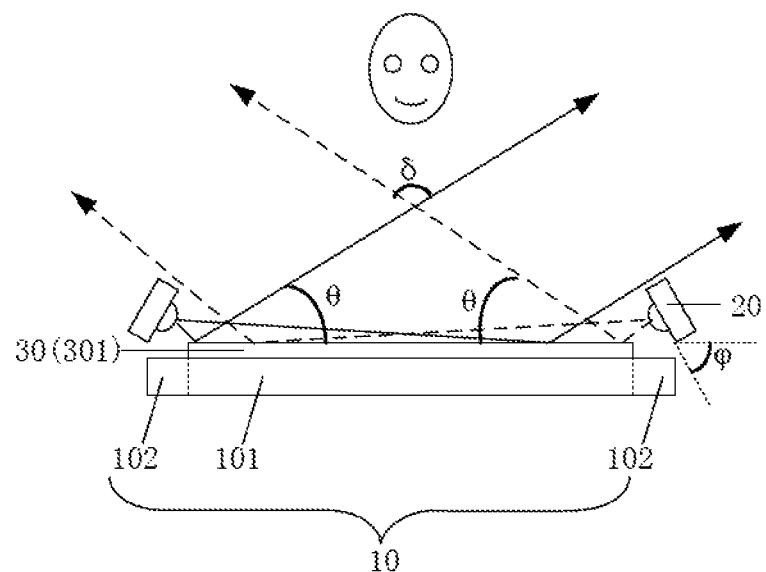
FIG. 2 illustrates a schematic view of another exemplary display device according to various disclosed embodiments of the present disclosure.
Figure 3:
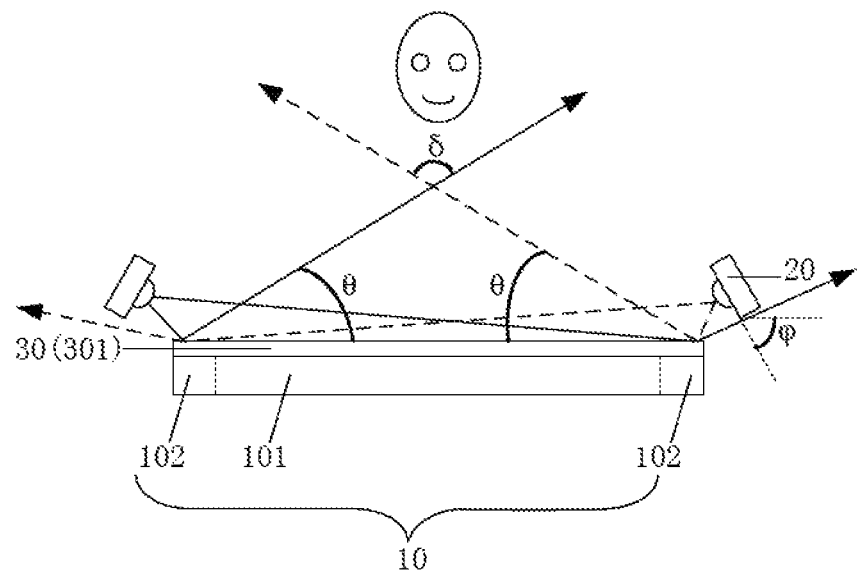
FIG. 3 illustrates a schematic view of another exemplary display device according to various disclosed embodiments of the present disclosure.

Referring to FIGS. 2-3, optionally and additionally, the light reflector 30 may correspond to at least the display region 101 of the display panel 10 and may also be able to allow the transmission of the light emitted from the display panel 10.

For example, as shown in FIG. 2, the light reflector 30 may correspond only to the display region 101 of the display panel 10. That is, the light reflector 30 may be situated exclusively on the display region 101 of the display panel 10. Alternatively, as shown in FIG. 3, in addition to the display region 101 of the display panel 10, the light reflector 30 may also correspond to the non-display region 102 of the display panel 10. That is, the light reflector 30 may overlap with both the display region 101 and the non-display region 102 of the display panel 10.

Further, because the light reflector 30 corresponds to the display region 101 of the display panel, the material used to form the light reflector 30 may need to have weak influence on the transmittance of the light emitted from the display panel 10 such that the normal display of the display panel 10 may not be affected. For example, the light reflector 30 may be made of any appropriate material that not only allows the transmittance of the light emitted from the display panel 10 but also reflects the light emitted from the light emitter 20 to the predetermined zone. For example, the light reflector 30 may be made of reflective glass, reflective coating, etc.

In one embodiment, with the light reflector 30 covering at least the display region 101 of the display panel 10, the reflected light beams emitted from the light emitter 20 may cover a maximized range of the predetermined zone. Therefore, the light emitted from the display panel 10 may interfere with the reflected light emitted from the light emitter 20 in the predetermined zone during display, and thus the contrast in the predetermined zone may be largely reduced. As such, confidential display may be secured.

In one embodiment, a reflective film 301 may be chosen as the light reflector 30 because of the weak influence on the transmittance of the light emitted from the display panel 10. For example, the reflective film 301 may be attached on the surface of the light-emitting side of the display panel 10.

In one embodiment, the thickness of the reflective film 301 may be small and the reflective film 301 may be directly attached onto the surface of the light-emitting side of the display panel 10. Therefore, the reflective film 301 may have weak influence on the total thickness of the display device and thus may meet the market demands on thinner display devices.

For example, the light emitter 20 may be arranged on the side of the reflective film 301 away from the display panel 10 and may be located in the predetermined zone. As such, the viewing effect in the front viewing region may not be affected by the light emitter 20 during display.

Figure 4A:
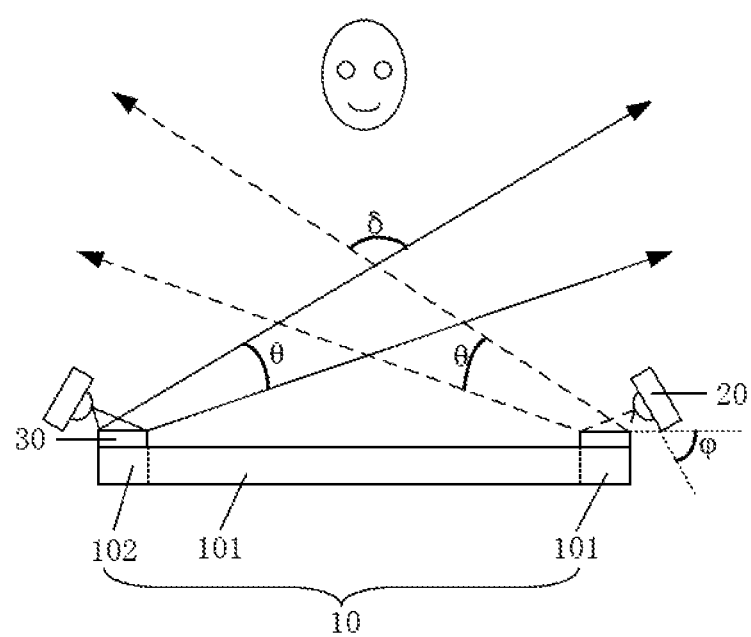
FIG. 4(a) illustrates a schematic view of another exemplary display device according to various disclosed embodiments of the present disclosure.

Optionally, referring to FIGS. 4(a) and 4 (b), the light reflector 30 may correspond to the non-display region 102 of the display panel 10. That is, the light reflector 30 may not be disposed on the display region 101 of the display panel 10.

Figure 4B:
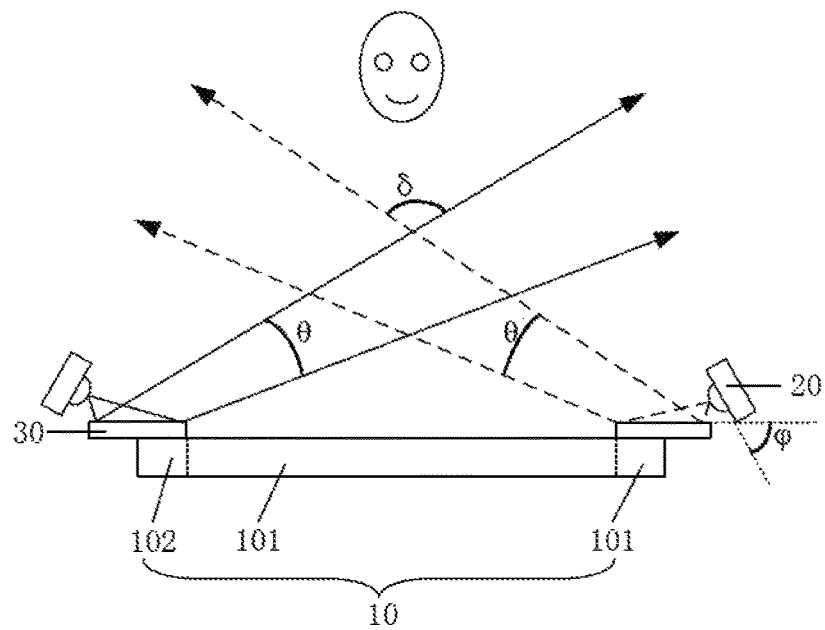
FIG. 4(b) illustrates a schematic view of another exemplary display device according to various disclosed embodiments of the present disclosure.

For example, as shown in FIG. 4(a), the light reflector 30 may exclusively correspond to the non-display region 102 of the display panel 10. Alternatively, as shown in FIG. 4(b), the light reflector 30 may be situated on a non-display region 102 of the display panel 10 and may extend out of the non-display region 102 from the edge of the display panel 10.

Figure 5:
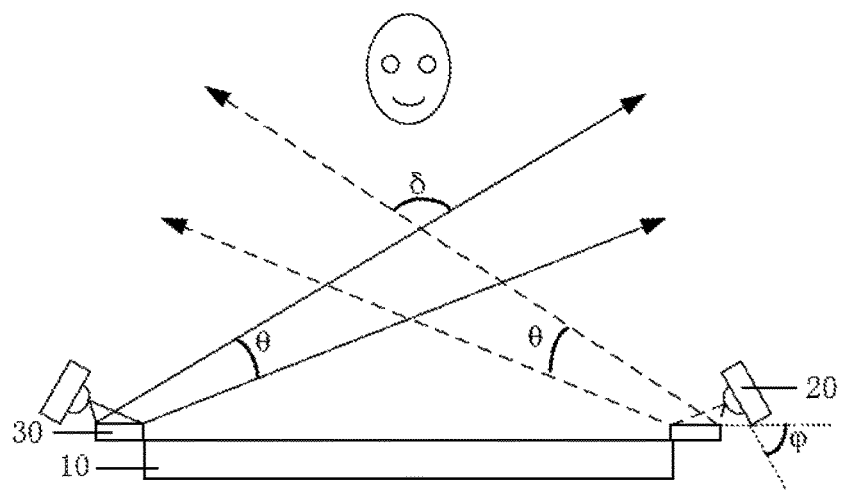
FIG. 5 illustrates a schematic view of another exemplary display device according to various disclosed embodiments of the present disclosure.

In other embodiments, referring to FIG. 5, the light reflector 30 may also be arranged completely outside of the outer perimeter of the display panel 10. That is, the light reflector 30 may not cover any portion of the display panel 10.

Further, when the dimensions of the light reflector 30 are small, the angle φ between the light emitter 20 and the light reflector 30 may be adjusted to allow the light emitted from the light emitter 20 to be reflected into a region in the predetermined zone close to the viewable region (i.e. the front viewing region) during confidential display. That is, reflected by the light reflector 30, the light emitted from the light emitter 20 may enter a region with a relatively large angle in the predetermined zone. Moreover, although the light reflected from the light reflector 30 may not enter the region of the predetermined zone closed to the surface of the display panel 10, the angle between the region and the surface of the display panel 10 may be very small so that the content displayed on the display panel 10 may not be viewable for the region closed to the surface of the display panel 10. That is, even without any interference light to reduce the visual contrast, the content displayed on the display panel 10 may be still not viewable for such a small view angle with respect to the surface of the display panel 10. Therefore, the region of the predetermined zone closed to the surface of the display panel 10 may not require special consideration in order to realize confidential display.

In one embodiment, arranging the light reflector 30 outside of the outer perimeter of the display panel 10 may refer to that along a direction perpendicular to the display panel, the projection of the light reflector 30 may not overlap with the display panel. For instance, using the non-reflecting region 102 as a reference, the light reflector 30 may be arranged outside of the non-display region 102 and away from the display region 101.

Further, when the light reflector 30 is arranged outside of the corresponding non-display region of the display panel 10 and away from the display region 101, the light reflector 30 may be mounted on the display panel 10 through a mounting structure.

Moreover, the light reflector 30 may be a reflective film 301 or any other appropriate structure. In one embodiment, when the light reflector 30 is a reflective film 301 and the projection of the reflective film 301 does not overlap with the display panel 10, the display device may include a bearing structure to support the reflective film 301. In other embodiments, the reflective film 301 may be supported by any other appropriate structure.

In one embodiment, the light reflector 30 may be placed at a position not affecting the display of the display panel 10 so that the transmission rate of the light emitted from the display panel 10 may not be affected.

Further, when light beams emitted from the light emitter 20 are parallel with each other, the light beams reflected from the corresponding light reflector 30 may then be restricted to a small region (i.e. a small θ angle) of the predetermined zone. That is, the reflected light beams may only cover a small portion of the predetermined zone. As such, the interference between the light emitted from the display panel 10 and the reflected light emitted from the light emitter 20 may not be sufficient in the entire predetermined zone. Therefore the anti-peeping effect may be limited. In one embodiment, the light beams emitted from the light emitter 20 are divergent light beams.

Figure 6A:
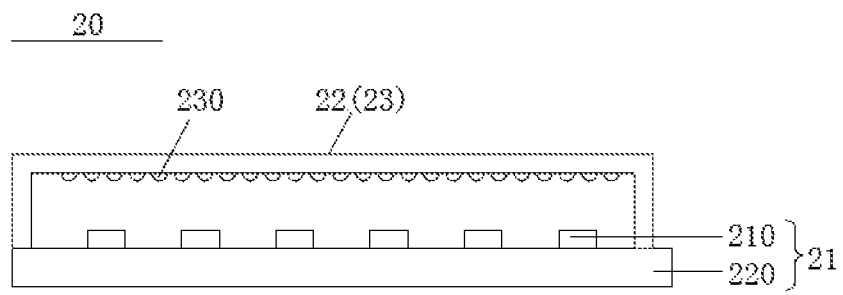
FIG. 6(a) illustrates a schematic view of an exemplary light emitter according to various disclosed embodiments.
Figure 6B:
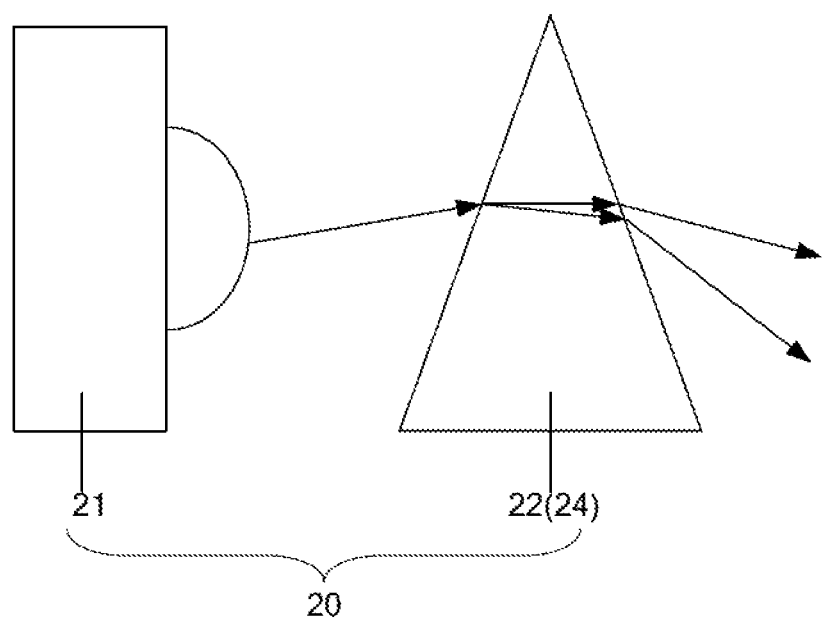
FIG. 6(b) illustrates a schematic view of another exemplary light emitter according to various disclosed embodiments.

Further, referring to FIGS. 6(a) and 6(b), the light emitter 20 includes a light bar 21 and a light-diverging structure 22. The light-diverging structure 22 may be configured to disperse the light beams emitted from the light bar 21. The divergent light beams may be reflected by the light reflector 30, and then may converge together and enter the predetermined zone.

For example, the light-diverging structure 22 may include a lampshade 23 as shown in FIG. 6 (a). Further, the light beams emitted from the light bar 21 may be dispersed or scattered by a plurality of optical dots 230 arranged on the surface of the lampshade facing to the light bar 21. Moreover, the plurality of optical dots 230 may be arranged randomly or into an array on the surface of the lampshade 23 facing to the light bar 21. In other embodiments, the surface of the lampshade facing to the light bar may also contain a plurality of cave-in features.

Further, the light-diverging structure 22 may also include a plurality of prisms 24 as shown in in FIG. 6(b). Alternatively, the light-diverging structure 22 may include a plurality of concave lens (not shown).

Moreover, the light bar 21 may be mounted with the light-diverging structure 22 through any appropriate method. For example, the light-diverging structure 22 may be directly mounted on the light bar 21 as long as the light-diverging structure 22 does not move respect to the light bar 21 after mounting.

In addition, because the light-diverging structure 22 is configured to disperse light beams, the light-diverging structure 22 may be made of a transparent material.

Further, using the light-diverging structure 22 to disperse the light beams emitted from the light bar 21 is merely aimed to ensure uniform distribution of the light beams emitted from the light bar 21 towards the entire light reflector 30. After reflected by the light reflector 30, without being reflected to all directions, the light beams may remain directional and convergent.

Figure 7:
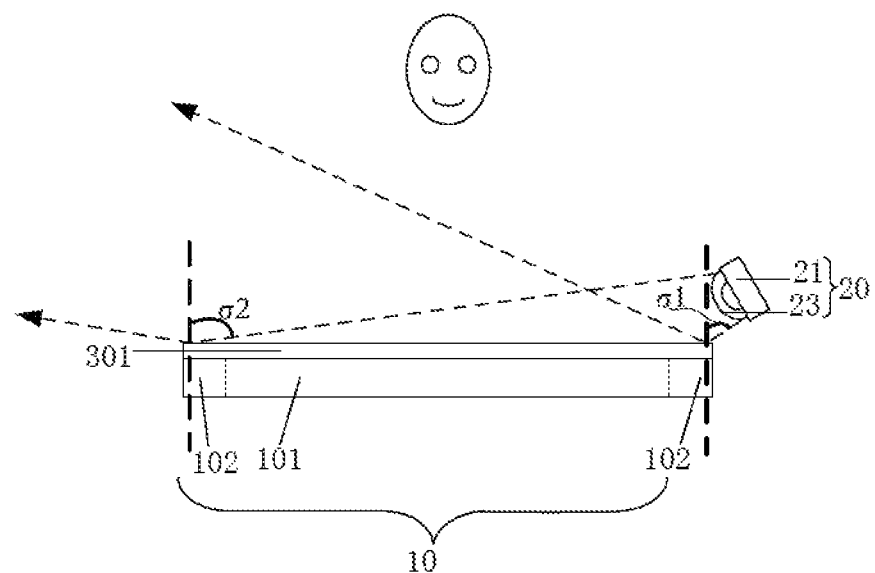
FIG. 7 illustrates a schematic view of another exemplary display device according to various disclosed embodiments.

Moreover, the light beams reflected by the light reflector 30 may converge together and enter the predetermined zone. FIG. 7 provides a diagram to illustrate the reflection of the light beams emitted from the light emitting structure 20. Referring to FIG. 7, light beams emitted from the light bar 21 are dispersed by the lampshade 23 and then shed on the light reflector 30. For each light beam towards the light reflector, an incident angle may be defined as the angle between incident light beam and the normal direction of the surface of the light reflector 30. For example, the minimum incident angle of the light beams towards the light reflector 30 may be $\sigma_1$ while the maximum incident angle may be $\sigma_2$.

According to the law of reflection (note: which is not a 'total' reflection), the reflection angle is equal to the incident angle. Thus, the minimum reflection angle of the light beams reflected by the light reflector 30 may be $\sigma_1$ while the maximum reflection angle may be $\sigma_2$. Therefore, after being reflected by the light reflector 30, the light beams coming from the light emitter 20 may converge to a region with an angle from 90°-$\sigma_2$ to 90°-$\sigma_1$ with respect to the surface of the light reflector 30.

In one embodiment, by arranging a light-diverging structure 22 on the light-emitting side of the light bar 21, light beams emitted from the light bar 21 may be dispersed so that the light beams coming from the light bar may be uniformly distributed and shed on the entire light reflector 30. As such, through the reflection of the light reflector 30, the light beams emitted from the light bar 21 may cover the entire predetermined zone, and thus confidential display may be realized.

In one embodiment, the light bar 21 includes a plurality of light-emitting diode (LED) chips. LED demonstrates a number of advantages such as high brightness, low heating, low energy consumption, long lifetime, etc. Therefore, using a LED light bar may improve the performance of the display device.

Further, referring to FIG. 6(a), the LED light bar may include a circuit board 220 and a plurality of LED chips 210. In one embodiment, the plurality of LED chips 210 may be arranged in a line.

In one embodiment, as shown in FIGS. 1-5, the light emitter 20 may be arranged on the two opposite edges of display panel 10. In other embodiments, the light emitter 20 may be arranged at a single place or may be arranged at more than two places that are separated from each other.

In one embodiment, by arranging the light emitter 20 on the two opposite edges of the display panel 10, the visual contrast in the predetermined zone on the two sides of the display panel may be reduced, and thus, the content of display may not be clearly viewed from the predetermined zone. Therefore, confidential display may be secured.

Based on the structure elucidated above, the display device may further include a controller (not shown). The controller may be connected to the light emitter 20 and may be used to turn on or turn off the light emitter 20. As such, the display device may be able to switch between the confidential display mode and the normal display mode simply by pushing a button, and thus user experience may be improved.

Further, the controller may also be used to control the brightness of the light beams emitted from the light emitter 20.

In one embodiment, the display panel 10 may be a liquid crystal display (LCD) panel or an organic electroluminescent diode (OELD) display panel. Moreover, the display device may be a monitor, a television, a cellphone, a tablet computer, or any other product or component with display function.

For further illustration of the present disclosure, an example is provided below to describe more details about the display device. However, the scope of the present disclosure is not limited by the various disclosed embodiments.

Referring to FIG. 3, the disclosed display device includes a display panel 10, a reflective film 301 attached the surface of the light-emitting side of display panel 10, and two light emitter 20 arranged on the two opposite edges of the display panel 10. Further, the display device also includes a controller (not shown) to turn on or turn off the light emitter 20.

Referring to FIG. 6(a), the light emitter 20 further includes a light bar and a lampshade 23. The light bar 21 includes a circuit board 220 and a plurality of LED chips 210 arranged in a line on the circuit board. The lampshade 23 includes a plurality of optical dots 230 on the surface facing to the light bar 21. The plurality of optical dots 230 are used to disperse the light beams emitted from the light bar 21.

Referring to FIG. 3, the light bar 21 is arranged to have a $\varphi$ angle with respect to the reflective film 301 such that the light beams emitted from the light bar 21 may be reflected to a predetermined zone of the viewing region of the display panel 10 by the reflective film 301. As such, during confidential display, the displaying light from the display panel 10 may interfere with the reflected light emitted from the light emitter 20 in the predetermined zone, and thus the visual contrast may be reduced.

Generally, a contrast below $\chi$ % may be regarded as a targeted product contrast. That is, for a contrast below $\chi$ %, the content displayed on the display panel 10 may not be clearly identified and the viewer may not clearly see the content displayed on the display panel 10. For example, a value of $\chi$ in a range from 5 to 29 (i.e. 5<$\chi$<29) may ensure the confidential display effect.

The contrast is calculated by:

$$\chi = \frac{B}{D},$$

where B is a brightness, during normal display of the display panel 10, at the $\theta$ angle from each side of the display panel 10, while D is a brightness, during a black display of the display panel 10, at the $\theta$ angle from each side of the display panel 10.

When the light beams from the light emitter 20 are reflected into the predetermined zone by the reflective film 301, the contrast is calculated by:

$$\chi = \frac{B+C}{D+C},$$

where C is a brightness of the light beams of the light emitter 20 reflected to the predetermined zone f e reflective film 301. In addition, D may be very small as compared to C, and thus may be negligible. Therefore, the formula to calculate the contrast may be reduced to $$\chi = \frac{B+C}{C}.$$

From the formula $$\chi = \frac{B+C}{C}, C = \frac{B}{\chi^{-1}}$$

may be obtained. Therefore, when $\chi$ and B are both known, the brightness of the reflected light beams may be obtained following the above formula. Further, the brightness of the light beams emitted from the light emitter 20 may then be controlled based on the calculated value.

Based on the description above, during normal display, the controller may turn off the light emitter 20 and the light beams emitted from the display panel 10 may be transmitted through the reflective film 301. In this case, the divergence angle δ of the light beams emitted from the display panel may be the viewable angle of the display panel 10, and thus the δ angle may be in a relatively large range.

During confidential display, the controller may turn on the light emitter 20. The light beams emitted from the light bar 21 may be dispersed by the lampshade 23 and shed on the reflective film 301. Further, the light beams may be reflected to the predetermined zone of the viewing region of the display panel 10 by reflective film 301. Referring to FIG. 3, the predetermined zone of the viewing region of the display panel 10 may be the region on each side of the display panel 10 with in a θ angle from the surface of the display panel 10. Because the light beams from the light emitter 20 may be reflected into the predetermined zone, the light beams from the light-display panel 10 may interfere with the reflected light beams emitted from the light emitter 20 in the predetermined zone, leading to reduced contrast. Accordingly, the divergence angle δ of the displaying light from the display panel 10 may be in a range of 180°-2θ.

Figure 8:
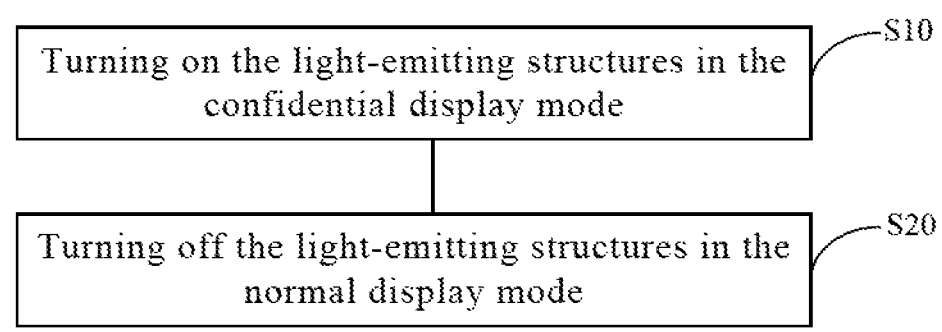
FIG. 8 is a flow chart of an exemplary control method according to various disclosed embodiments.

The present disclosure also provides a control method for the display device described above. Depending on to-be-displayed content, the display on the display device may be switchable. FIG. 8 shows a flow chart of an exemplary control method according to varies embodiments.

Referring to FIG. 8, the control method may include turning on the light emitter 20 during confidential display (S10). For example, when the light emitter 20 is turned on, the light beams emitted from the light emitter 20 may be reflected to the predetermined zone by the light reflector 30. The displaying light from the display panel 10 during display may interfere with the reflected light emitted from the light emitter 20 in the predetermined zone, leading to reduced visual contrast, which may be equivalent to decrease in the divergence angle δ for the light beams emitted from the display panel 10. As such, confidential display may be realized.

Moreover, the control method may also include turning off the light emitter 20 during normal display (S20). For example, when the light emitter 20 is turned off, no light beams from the light emitter 20 can interfere with the light beams emitted from the display panel 10, and thus the divergence angle of the light beams from the display panel 10 may be the viewable angle of the display panel 10.

According to the disclosed control method, the display device may be able to switch between the confidential display mode and the normal display mode simply by pushing a button, and thus user experience may be improved.

Further, in the confidential display mode, the controller may also be configured to adjust the brightness of the light beams emitted from the light emitter 20. For example, adjusting the brightness of light beams emitted from the light emitter 20 may meet the customer demands on confidential display under different light intensities.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated.

It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the disclosure.

It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A display device, comprising:
a light emitter, configured to emit light; and
a light reflector, configured to reflect the light from the light emitter onto one or more side viewing regions of a viewing region of a display panel;
wherein the viewing region further includes a front viewing region in front of the display panel;
the one or more side viewing regions are adjacent to the front viewing region;
the light emitter is configured to emit divergent light beams towards the light reflector;
the light emitter includes a light bar and a light-diverging structure; and
the light bar includes a plurality of light-emitting diode (LED) chips.

2. The display device of claim 1, wherein:
a projection of the light reflector in a plane of the display panel overlaps with at least a display region of the display panel; and
the light reflector is further configured to transmit light beams from the display panel when displaying.

3. The display device of claim 2, wherein:
the light reflector includes a reflective film; and
the reflective film is attached on a light-exiting surface of the display panel.

4. The display device of claim 3, wherein the light emitter is configured in the one or more side viewing regions and on one side of the reflective film away from the display panel.

5. The display device of claim 1, wherein:
a projection of the light reflector in a plane of the display panel overlaps with a non-display region of the display panel.

6. The display device of claim 1, wherein:
a projection of the light reflector in a plane of the display panel is outside of an outer perimeter of the display panel.

7. The display device of claim 1, wherein:
the light-diverging structure is configured to disperse light beams emitted from the light bar; and the divergent light beams are reflected by the light reflector and converged together to enter the one or more side viewing regions of the viewing region of the display panel.

8. The display device of claim 7, wherein:
the light-diverging structure includes a lampshade;
a plurality of optical dots is arranged on a surface of the lampshade facing to the light bar; and
the plurality of optical dots is configured to disperse the light beams emitted from the light bar.

9. The display device of claim 7, wherein:
the light-diverging structure includes one or more of prisms and concave lens; and
the one or more of the prisms and the concave lens are configured to disperse the light beams emitted from the light bar.

10. The display device of claim 1, wherein:
the light emitter is arranged and configured at edge regions of the display panel.

11. The display device of claim 1, further including a controller, wherein:
the controller is connected with the light emitter; and
the controller is configured to turn on or turn off the light emitter.

12. The display device of claim 11, wherein:
the controller is further configured to adjust a brightness of the light emitted from the light emitter.

13. The display device of claim 1, wherein:
the display panel is a liquid crystal display (LCD) panel or an organic electroluminescent diode (OELD) display panel.

14. A method for controlling the display device according to claim 1, comprising:
turning the light emitter of the display device on to emit light beams in a confidential display mode; and
turning the light emitter of the display device off in a normal display mode.

15. The control method of claim 14, wherein:
in the confidential display mode, a contrast between a brightness of light beams emitted from the display panel and a brightness of reflected light beams from the light emitter is in a range of approximately 5% to 29%.

16. The control method of claim 14, further including:
adjusting a brightness of the light emitted from the light emitter in the confidential display mode.

17. The control method of claim 14, wherein:
the display panel is an LCD panel or an OELD display panel.

* * * * *